United States Patent [19]

Franke

[11] Patent Number: 4,524,336

[45] Date of Patent: Jun. 18, 1985

[54] WIDE RANGE REFLECTIVE PHASE SHIFTER/MODULATOR

[75] Inventor: Earnest A. Franke, Goode, Va.

[73] Assignee: General Electric Company, Lynchburg, Va.

[21] Appl. No.: 434,537

[22] Filed: Oct. 15, 1982

[51] Int. Cl.³ .............................................. H03C 3/00
[52] U.S. Cl. .................................... 332/16 R; 332/22; 455/42
[58] Field of Search ................. 332/16 R, 16 T, 23 R, 332/29 R, 30 R, 30 V, 22; 455/42, 110, 111; 331/177 V

[56] References Cited

U.S. PATENT DOCUMENTS

| | | | |
|---|---|---|---|
| 3,409,845 | 11/1968 | Ogi et al. | 331/177 V |
| 3,569,866 | 3/1971 | Hearn | 332/30 |
| 3,739,301 | 6/1973 | Garver | 332/16 R |
| 3,967,217 | 6/1976 | Solomon | 332/16 R X |
| 4,055,822 | 10/1977 | Rinderle | 331/177 V X |
| 4,216,542 | 8/1980 | Hermesmeyer | 332/22 X |

Primary Examiner—Eugene R. LaRoche
Assistant Examiner—Robert J. Pascal
Attorney, Agent, or Firm—Cushman, Darby and Cushman

[57] ABSTRACT

A wide range reflective phase shifter/modulator including a 3dB hybrid splitter having ports A, B, C and D. An input signal to be phase modulated is applied to port-A and the phase modulator output signal is derived from port-C. Ports B and D are terminated with reactive circuits, which must be identical, including four variable reactive elements such as varactor diodes, the capacitance of which can be controlled by a modulating control voltage. By controlling the capacitance of the varactor diodes, the amount of phase shift in the signal derived from port-C is controlled. An alternative embodiment includes a circulator having ports E, F and G. An input signal to be phase modulated is applied to port-E and the phase modulator output signal is derived from port-G. Port-F is terminated with a reactive circuit, which includes two variable reactive elements such as varactor diodes, the capacitance of which can be controlled by a modulating control voltage. By controlling the capacitance of the varactor diodes, the amount of phase shift in the signal derived from port-G is controlled.

3 Claims, 6 Drawing Figures

U.S. Patent    Jun. 18, 1985    Sheet 2 of 2    4,524,336
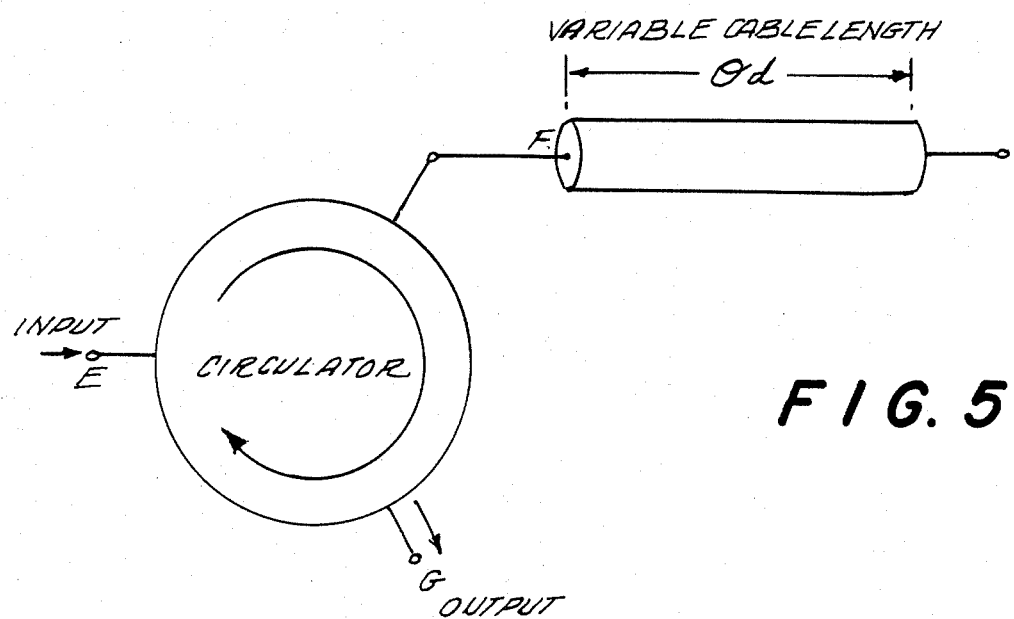
FIG. 5
FIG. 6
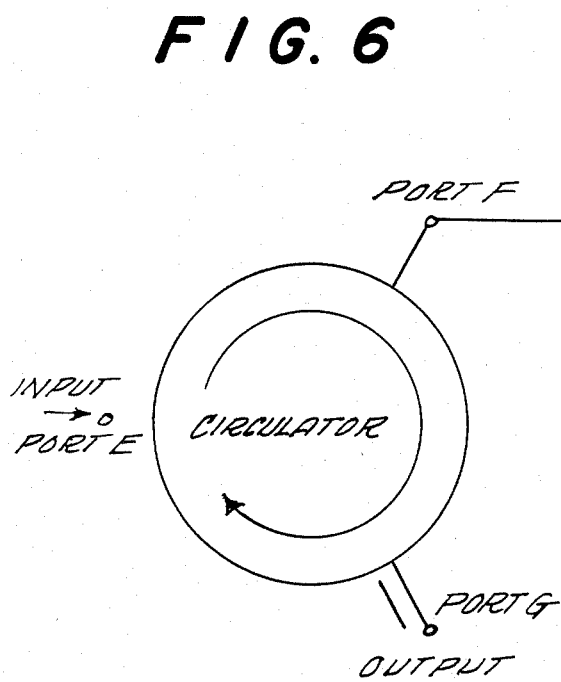

WIDE RANGE REFLECTIVE PHASE SHIFTER/MODULATOR

BACKGROUND OF THE INVENTION

The present invention relates in general to phase shifters or phase modulators, particularly of the type used in radios. More specifically, the present invention provides a phase shifter/modulator utilizing a hybrid splitter terminated at both of its normal output ports with a reactive circuit; or a circulator terminated at its normal output port with a reactive circuit.

Mobile radio telephony frequently requires a phase modulator capable of modulating the phase of a carrier by large amounts. As an example of such a requirement, cellular mobile radio-telephone systems require a deviation of ±12 radians peak for a 1 kHz tone. This corresponds to a phase deviation of ±687.5 degrees peak modulation. Normally transmitters employ varicap (variable capacitance) modulators. This type of modulator uses the variation of phase shift of a detuned resonant circuit. Relative to the phase of the current at resonance, the current in a tuned circuit will vary from nearly +90 degrees to nearly −90 degrees. This theoretical maximum phase deviation of ±90 degrees (about 1½ radians) is typically limited to ±1 radian where the phase variation with modulation voltage is nearly linear. In order to achieve a higher value of phase deviation, a low frequency carrier is phase modulated and then multiplied to achieve the correct operating frequency. One could also simply connect two phase modulators in tandem (series) to achieve the sum phase deviation.

The U.S. patent literature includes the following patents showing various circuits utilizing hybrid splitters and other such devices terminated by a reactive device or circuit. It is not intended to be an exhaustive list, but only a representative sample of patents.

U.S. Pat. No. 4,216,542—Hermesmeyer (Aug. 5, 1980)
U.S. Pat. No. 4,021,758—Standing (May 3, 1977)
U.S. Pat. No. 3,961,286—Kim (June 1, 1976)
U.S. Pat. No. 3,946,337—Philips et al (Mar. 23, 1976)
U.S. Pat. No. 3,798,573—Seidel (Mar. 19, 1974)
U.S. Pat. No. 3,745,250—Gerst (July 10, 1973)
U.S. Pat. No. 3,579,147—Brown (May 18, 1971)
U.S. Pat. No. 3,479,615—Garver (Nov. 18, 1969)
U.S. Pat. No. 3,440,570—Kasper (Apr. 22, 1969)
U.S. Pat. No. 3,440,342—Putnam (Sept. 3, 1968)

In addition, the patent literature includes the following U.S. patents relating to phase shift circuits. Again, this is not intended to be an exhaustive list, but merely a representative sample of patents.

U.S. Pat. No. 3,938,042—Gliever et al (Feb. 10, 1976)
U.S. Pat. No. 3,916,344—Enderby (Oct. 28, 1975)
U.S. Pat. No. 3,328,727—Lynk, Jr. (June 27, 1975)
U.S. Pat. No. 3,275,951—Maass (Sept. 27, 1966)
U.S. Pat. No. 3,267,393—Brossard et al (Aug. 16, 1966)
U.S. Pat. No. 3,196,368—Potter (July 20, 1965)
U.S. Pat. No. 3,101,452—Holcomb et al (Aug. 20, 1963)

None of the above-listed documents show a reflective-type phase shifter/modulator as set forth herein for achieving wide range phase shift.

SUMMARY OF THE INVENTION

Therefore, there is provided by the present invention a wide range phase shifter. The underlying concept of the phase modulator is the combination of a purely reactive termination with a circuit which completely separates incident and reflective waves. In the preferred embodiment, a 3 dB hybrid splitter serves as the circuit element separating incident and reflective waves. In alternative embodiments, the 3 dB hybrid splitter could be replaced by a circulator or a phase balanced circuit. The purely reactive termination could be either a coaxial cable or a reactive network. In the presently preferred embodiment, the termination is a purely reactive network including varactor diodes to which the modulating control voltage can be applied. The modulating voltage changes the capacitance of the varactor diode thereby changing the reactance of the termination network and controlling the amount of phase shift.

The presently preferred embodiment includes a 3 dB hybrid splitter having ports A, B, C and D. An input signal to be phase modulated is applied to port A and the output phase modulated signal is derived from port C. A first reactive network terminates port B by being coupled from it to ground. This first reactive network includes two series circuits each including an inductor and a varactor diode with means for applying a control voltage to the varactor diodes. Similarly, a second reactive circuit terminates port D of the hybrid. This second reactive circuit also includes two series circuits each including an inductor and varactor diode with means for applying the modulation control voltage to the varactor diodes.

In essence the present invention provides a phase modulator comprising: a hybrid splitter having first, second, third and fourth ports, an input signal at said first port being split to form two equal power signals at said second and fourth ports and signals input to said second and fourth ports being combined at the third port; a first reactive load terminating said second port, a second reactive load terminating said fourth port; means for varying the reactance of said first and second reactive loads; means for applying an input signal to said first port; and means for deriving an output signal from said third port, said output signal being phase shifted with respect to said input signal at least in part as a function of the reactance of said first and second reactive loads.

In other words, the present invention provides a phase modulator comprising a 3 dB hybrid splitter having A, B, C, and D ports; means for applying an input signal to said A-port; means for deriving an output signal from said C-port; first variable reactive load means, coupled to said B-port, for causing a signal flowing from said A-port to said B-port to be reflected to said A and C ports; second variable reactive load means, coupled to said D-port, for causing a signal flowing from said A-port to said D-port to be reflected to said A and C ports; the values of reactance of said first and second reactive loads being selected such that signals reflected to said A-port from said B and D ports cancel each other and signals reflected to said C-port from said B and D ports constructively add to produce a signal at said C-port that has predetermined phase shift with respect to a signal applied to said A-port.

BRIEF DESCRIPTION OF THE DRAWINGS

A preferred exemplary embodiment of the present invention will be described in detail with reference to the drawings wherein:

FIG. 5 is a schematic representation of an alternative embodiment of the phase modulator using a circulator instead of a hybrid splitter; and FIG. 6 is a schematic diagram of a phase modulator using the reactive networks of FIG. 3 in place of the variable length cable shown in the FIG. 5 embodiment.

DETAILED DESCRIPTION OF THE PREFERRED EMBODIMENT

Figure 1:
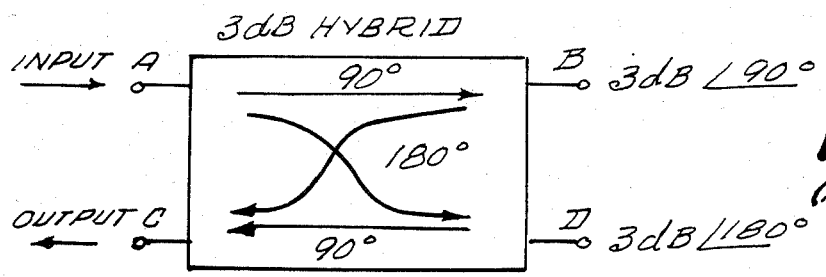
FIG. 1 is a block diagram representation of a 3 dB hybrid splitter, known in the prior art.

Referring now to FIG. 1 (Prior Art) there is schematically shown a 3 dB hybrid splitter. The hybrid splitter includes ports A, B, C and D, port A being considered the reference port from which all phase shifts are measured. An input signal applied to port A will be equally split between ports B and D, i.e. signal applied to port A. However, the signals at port B and D will be 90 degrees apart in phase from one another. An input signal applied to port A will be shifted 90 degrees in its travel to port B and it will be shifted 180 degrees in its travel to port D. Thus, the port B signal will be 3 dB down and 90 degrees phase shifted from the signal applied at port A and the signal at port D will be 3 dB down and 180 degrees phase shifted from the signal applied at port A.

Port C, used as an output port in this invention, provides a summation of signals reflected at ports B and D. A signal applied at port B undergoes a 180 degree phase shift in its travel to port C and a signal reflected at port D undergoes a 90 degree phase shift in its travel to port C.

Figure 2:
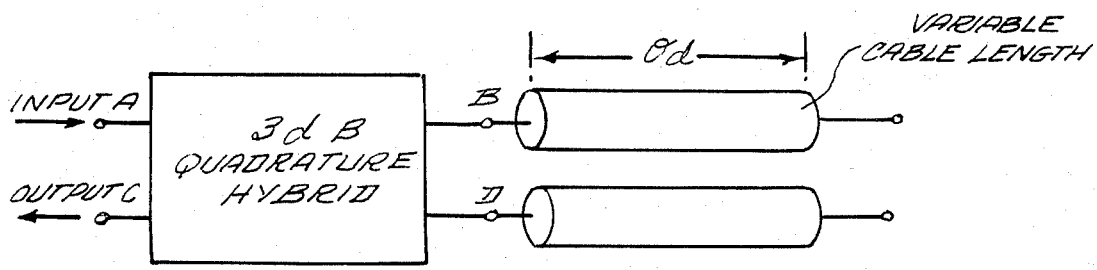
FIG. 2 is a schematic representation of a phase modulator according to the present invention.

Referring now to both FIGS. 1 and 2, the concept of this invention will be further explained. The phase modulator according to the present invention combines a purely reactive termination with a circuit such as a hybrid splitter or circulator which completely separates incident and reflected waves. A variation in the terminating reactance will produce a change in the phase of the reflected output wave. If a transmission line is terminated in a pure reactance, all of the energy incident upon the termination is reflected and the phase shift of the reflected wave is a function of the magnitude of the reactance. This concept can be applied to the 3 dB hybrid as follows.

Referenced to port A, to which an input signal to the phase modulator is applied, port B displays a 3 dB coupling but a 180 degree phase shift relative to port A. If identical purely reactive terminations were placed on ports B and D, and port C was terminated in its characteristic impedance, the reflected signal at the input would consist of two signals. The reflected signal at port A from port B would have a round-trip delay of 180 degrees. The reflected signal from port D also at port A would have a round-trip delay of 360 degrees. Thus, these equal amplitude signals would cancel at port A due to their 180 degree phase relationship.

The reflected signal at output port C would also contain two signals. The reflected signal from port B would contain a phase shift of 270 degrees relative to the input at port A. The reflected signal from port D would also contain a phase shift of 270 degrees. These two reflected signals would constructively add. Thus, there would be a perfect match at input port A and an output signal at port C. If two equal lengths of coaxial cable were coupled to ports B and D as shown in FIG. 2, the signal at input port A would still contain two reflected signals 180 degrees out of phase. The phase of the signal at output port C however would change its phase relative to input port A. In the absence of the coaxial cable, this phase shift would have been 270 degrees with respect to port A. With the coaxial cable this phase shift would become 270 degrees plus twice the delay ($\theta d$) in either cable. The double delay is due to the round-trip delay in a single cable. If the length of the coaxial cable were changed, one would observe a phase deviation at port C equal to twice the phase change in each cable. Thus, if the coaxial cable length were to vary over one-half wavelength (180 degrees), then the output phase at port C would vary by 360 degrees.

The coaxial line can be replaced with a lumped constant circuit which electrically rotates around the Smith Chart in the same manner as an open-circuited (or short-circuited) coaxial line stretcher.

Figure 3:
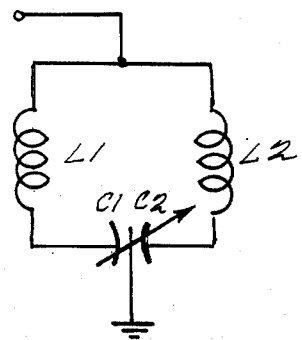
FIG. 3 is a reactive network which can be substituted for a coaxial line structure shown in FIG. 2.

Referring now to FIG. 3 there is shown a lumped constant circuit presenting a purely reactive load which can be used to electrically rotate around the Smith chart.

$$\text{Let } Z_1 = j\omega L_1 - j\frac{1}{\omega C_1} = jX_{L1} - jx_{C1} \quad \omega = 2\pi f \quad (1)$$

$$Z_2 = j\omega L_2 - j\frac{1}{\omega C_2} = jX_{L2} - jx_{C2} \quad (2)$$

The input impedance to the network is simply the parallel combination.

$$Z_{in} = \frac{Z_1 Z_2}{Z_1 + Z_2} \quad (3)$$

Substituting and combining yields;

$$Z_{in} = j\frac{\left(\omega L_1 - \frac{1}{\omega C_1}\right) \cdot \left(\omega L_2 - \frac{1}{\omega C_2}\right)}{\omega(L_1 + L_2) - \frac{1}{\omega}\left(\frac{1}{C_1} + \frac{1}{C_2}\right)} \quad (4)$$

It can be observed that there are two zeros (series resonances) in the numerator of equation 4 and one pole (parallel resonance) in the denominator of equation 4. This establishes that the path around the Smith chart is monotonically reactive. To insure that the reactive circuit shown in FIG. 3 goes through two zeroes and one pole in a range of frequencies from a first frequency $F_1$ (low) to a second frequency $F_2$ (high), it is necessary to set limits on the reactances of L1, L2 and C1 and C2. These limits are as follows: L1 resonates when C1 is maximum at the lowest frequency F1. L2 resonates when C1 is minimum at the highest frequency F2. The capacitor C1 equals capacitor C2.

Figure 4:
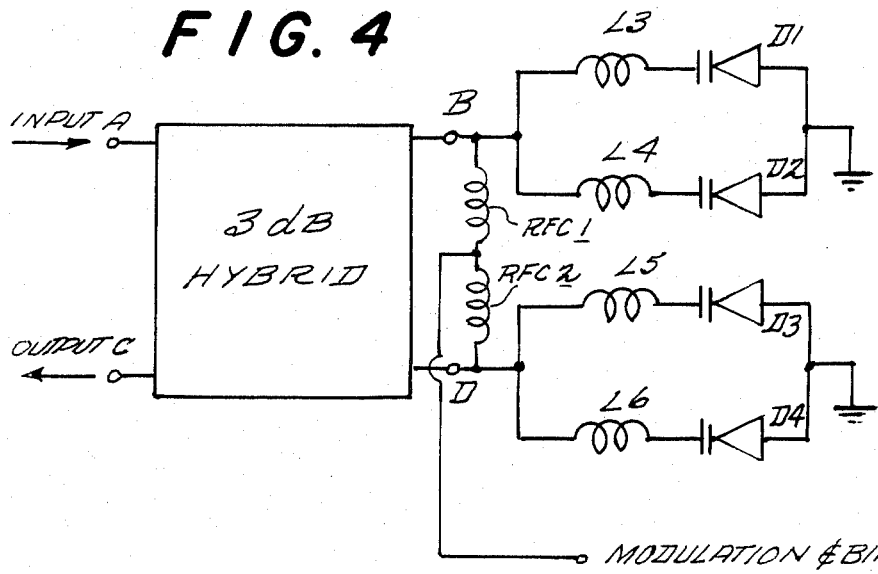
FIG. 4 is a schematic diagram of a phase modulator according to the present invention using reactive networks for controlling the amount of phase modulation.

Referring now to FIG. 4 there is shown a more practical embodiment that can easily be incorporated into radios utilizing phase modulation. In the FIG. 4 arrangement, there is substituted for the butterfly capacitor C1–C2 shown in FIG. 3, a set of matched variable capacitance diodes such as D1 and D2 or D3 and D4 such as varactor diodes. Thus, the upper coaxial cable shown in FIG. 2 is replaced by the reactive network including L3, L4 and D1 and D2 and the lower coaxial cable shown in FIG. 2 is replaced by the reactive network including L5, L6, D3 and D4. Control voltages appied to reactive diodes D1–D4 via RF chokes RFC1 and RFC2.

This invention also provides for the substitution of a circulator in place of the 3 dB hybrid splitter. The circulator shown in FIG. 5 has the property that an input signal applied at said port-E will be circulated in the direction of said port-F. The circulated signal appearing at port-F, due to an input signal at port-E, will be totally reflected by the purely reactive termination placed at said port-F. This reflected signal will continue in the direction of circulation towards the output port-G. The apparent phase shift evidenced at port-G will be equal to twice the variation in cable length. This is due to the round trip path of the signal within the coaxial cable.

The concept of a variable reactive load coaxial cable is replaced with the purely reactive network of FIG. 3 in the schematic representation of FIG. 6. A signal voltage applied to the modulation input will cause the signal from port-G to vary in phase in concert with the applied voltage.

While the invention has been described in connection with what is presently considered to be the most practical and preferred embodiments, it is to be understood that the invention is not to be limited to the disclosed embodiments but on the contrary is intended to cover various modifications and equivalent arrangements included within the spirit and scope of the appended claims which scope is to be accorded the broadest interpretation so as to encompass all such modifications and equivalent structures.

What is claimed is:

1. A phase modulator comprising:
a hybrid splitter of the type having first, second, third and fourth ports, wherein an input signal applied to said first port is split to form equal power signals at said second and fourth ports and signals input to said second and fourth ports are combined at said third port;
means for applying an input signal to be phased shifted to said first port;
a first reactive network having continuously variable reactance coupled to said second port, said first reactive network including first and second series circuits in parallel to one another, each series circuit including an inductor and a variable capacitance diode;
a second reactive network having continuously variable reactance coupled to said fourth port, said second reactive network including third and fourth series circuits in parallel with one another, each series circuit including an inductor and a variable capacitance diode;
means for applying a modulating signal to the inductors of each of said reactive networks simultaneously, the diodes of said networks always being reversed biased; and
means for deriving an output signal from said third port, said output signal being phase shifted with respect to said input signal at least in part as a function of the modulating signal applied to said inductors.

2. A phase modulator, comprising:
two or more phase shifters in series, each phase shifter comprising
a hybrid splitter having first, second, third, and fourth ports, wherein an input signal applied to said first port is split to form two equal power signals at said second and fourth ports and signals input to said second and fourth ports are combined at said second port;
a first reactive network having continuously variable reactance coupled to said second port, said first reactive network including first and second series circuits in parallel with one another, each series circuit including an inductor and a variable capacitance diode;
a second reactive network having continuously variable reactance coupled to said fourth port, said second reactive network including third and fourth series circuits in parallel with one another, each series circuit including an inductor and a variable capacitance diode;
means for applying an input signal to be phased shifted to said first port of the first phase shifter of said series of phase shifters;
means for coupling an output signal from said third port of each phase shifter of the series of phase shifters to the first port of the next phase shifter of the series of phase shifters, the output of the phase modulator being taken at the third port of the last shifter of the series; and
means for coupling a modulating signal simultaneously to the inductors of each series circuit of said first and second reactive networks the diodes of said series circuits always being reverse biased.

3. A phase modulator comprising:
a circulator having a predetermined direction of circulation and having first, second and third ports, said first port being adapted to receive an input signal;
means for applying an input signal to be phase shifted to said first port;
a reactive network having a continuously variable reactance coupled to said second port for causing a signal flowing from said first port to said second port to be reflected at said second port and to propagate in the direction of circulation of said network, said reactive network including first and second series circuits in parallel with one another each series circuit including an inductor and a variable capacitance diode;
means for applying a modulating signal to the inductors of said first and second series circuits simultaneously, the diodes thereof always being reversed biased; and
means for deriving an output signal from said third port, said output signal being phase shifted with respect to said input signal at least in part as a function of the reactance of said reactive network.

* * * * *